(12) United States Patent
Prasad-Roth

(10) Patent No.: US 6,714,029 B2
(45) Date of Patent: Mar. 30, 2004

(54) CONTACT PIN FOR TESTING MICROELECTRONIC COMPONENTS HAVING SUBSTANTIALLY SPHERICAL CONTACTS

(75) Inventor: Arti Prasad-Roth, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/320,127

(22) Filed: Dec. 16, 2002

(65) Prior Publication Data

US 2003/0112026 A1 Jun. 19, 2003

(30) Foreign Application Priority Data

Dec. 15, 2001 (DE) .......................... 101 61 755

(51) Int. Cl.⁷ .............................. G01R 31/02
(52) U.S. Cl. .................. 324/754; 324/757; 174/266
(58) Field of Search ................ 324/757, 754, 324/158.1, 755, 756, 758; 200/19.25; 439/343, 266, 83, 261; 174/261, 263, 266

(56) References Cited

U.S. PATENT DOCUMENTS

| 5,685,725 A | 11/1997 | Uratsuji |
| 6,186,816 B1 * | 2/2001 | Lu et al. ...................... 439/342 |
| 6,283,780 B1 * | 9/2001 | Yamamoto et al. ......... 439/266 |

FOREIGN PATENT DOCUMENTS

| DE | 195 33 272 A1 | 3/1996 |
| JP | 2000180469 A | 6/2000 |

* cited by examiner

Primary Examiner—Evan Pert
Assistant Examiner—Trung Q. Nguyen
(74) Attorney, Agent, or Firm—Laurence A. Greenberg; Werner H. Stemer; Gregory L. Maybeck

(57) ABSTRACT

In order to test, in particular, BGA (Ball Grid Array) contacts, the free contact pin end is formed as a suction tube in which a reduced pressure that acts on the end area of the free contact pin end can be produced. If the diameter of the suction tube is less than the diameter of the component contact with which contact is to be made, a mechanical and electrical contact can be produced by sucking an approaching component contact onto the end area of the contact pin end, without having to exert pressure on the rear face of the component.

7 Claims, 1 Drawing Sheet

CONTACT PIN FOR TESTING MICROELECTRONIC COMPONENTS HAVING SUBSTANTIALLY SPHERICAL CONTACTS

BACKGROUND OF THE INVENTION

Field of the Invention

The invention relates to a contact pin for testing microelectronic components having substantially spherical contacts, in particular ICs with BGA (Ball Grid Array) packs. The cylindrical free end of the contact pin interacts with the component contact to be tested.

Contact pins of this type are already commercially available.

IC modules are normally subjected to an electrical function test after their production. For this purpose, the connecting contacts or pads of the IC, which depending on the pack shape and connection technology may be designed very differently, are brought into contact with a number of contact pins that are electrically connected to an evaluation circuit or to a test device. The contact pins are in this case typically held in a cap or adapter, to be precise in a configuration that corresponds to the configuration of the connecting contacts.

For testing, the IC module is generally lowered with connecting contacts pointing downward onto the contact pins projecting from a cap. In order to ensure a sufficiently high contact force and hence a low contact resistance between the connecting contact and the contact pin, and in order to ensure that the contact pin and connecting contact are centered during the test, a mechanical pressure is in this case exerted on the rear face of the IC, from above. However, this is generally problematic, since it can lead to mechanical damage, in particular to a fracture of the IC module. The parts of the test configuration may be lowered and pressed into contact either by hand or in an automated manner.

The contact pins are commercially available in a large number of variations. In addition, spring contact pins, sometimes referred to as pogo pins, are also known, in the case of which at least one contact pin end can be moved axially with a defined spring force. Depending on the material, configuration and the sensitivity of the connecting contacts to be tested, the contact pin ends may, for example, be designed in the form of tips, crowns or in a rounded form at the contact end.

Special requirements for the testing technology arise in conjunction with testing IC modules with spherical or hemispherical (connecting) contacts arranged in a grid, in particular when testing modules of the BGA (Ball Grid Array) type. These also include, for example, so-called CSPs (Chip Size Packages). As a result of the necessary contact pressure, which is often not transmitted from the contact pin at right angles onto the lowermost point of the solder ball, but at an angle that is not desirable, the solder balls are frequently subject to the formation of grooves or to deformation. Overall, the known test arrangements for testing BGA contacts do not satisfy the requirements to which non-destructive testing is subject, especially after a number of contact cycles.

Published German Patent Application DE 195 33 272 A1 discloses a test contact that can be embedded in a cap and is not cylindrical at the contact end, but includes two resilient tongues which open in a V-shape and between which the contact ball is held such that it makes contact reliably, but is mechanically protected when the contact pressure is applied. The known test contact, which is intended to prevent the formation of grooves on the solder ball, is based on a force that is applied to produce the contact pressure, which as described above is generally not permissible. Furthermore, by virtue of its construction, the known test contact cannot be used universally.

U.S. Pat. No. 5,685,725 discloses a contact pin for testing microelectronic components having substantially spherical contacts, whose first end, which interacts with the component contact to be tested, is cylindrical.

Published Japanese Patent Abstract JP 200180469 A furthermore discloses a contact apparatus for testing microelectronic components having substantially spherical contacts, in which a mechanical and electrical contact is produced by the suction of an approaching component.

SUMMARY OF THE INVENTION

It is accordingly an object of the invention to provide a contact pin of the type mentioned initially which overcomes the above-mentioned disadvantages of the prior art apparatus of this general type.

In particular it is an object of the invention to provide a contact pin of the type mentioned initially, which allows reliable and non-destructive testing of components, in particular, of BGA components, with at most a minimal contact pressure.

With the foregoing and other objects in view there is provided, in accordance with the invention, a contact pin for testing a microelectronic component having a substantially spherical contact with a diameter. The contact pin includes a first contact pin end part having an end area. The contact pin end part is formed as a suction tube for providing a reduced pressure at the end area. The suction tube has an internal diameter that is less than the diameter of the spherical contact of the microelectronic component, so that a mechanical and electrical contact can be produced by sucking the spherical contact of the microelectronic component onto the end area of the first contact pin end part as the spherical contact of the microelectronic component approaches the end area of the first contact pin end part.

In accordance with an added feature of the invention, the contact pin includes a coaxial inner part; and an annular end area formed between the suction tube and the coaxial inner part. The suction tube forms a sleeve surrounding the coaxial inner part; and the reduced pressure is provided at the annular end area.

In accordance with an additional feature of the invention, the suction tube and the coaxial inner part have a cross-sectional area that widens toward the end area of the contact pin end part.

In accordance with another feature of the invention, the contact pin includes a suction collar configured on the end area of the first contact pin end part. The suction collar opens substantially in a hemispherical shape.

In accordance with a further feature of the invention, the suction collar is made of elastic material.

In accordance with a further added feature of the invention, the first contact pin end part is cylindrical.

In accordance with yet an added feature of the invention, the microelectronic component, with which the contact pin is used, includes a Ball Grid Array pack.

In accordance with yet another feature of the invention, the contact pin is a spring contact pin.

In the case of a contact pin of the type mentioned initially, the object of the invention is achieved by forming the free contact pin end as a suction tube in which a reduced pressure that acts on the end area of the free contact pin end can be produced. The diameter of the suction tube is less than the diameter of the component contact with which contact is to be made, so that a mechanical and electrical contact can be produced by sucking an approaching component contact onto the end area of the contact pin end.

The invention makes it possible to dispense with exerting pressure on the rear face of the component. An approach or slight contact between the contact pin end and component contact is sufficient in order to produce an electrical contact and a fixed-position configuration of the parts of the test system just by the suction force, and to maintain this without any disturbance of the electrical measurements being carried out. The mechanical load on the component and on its spherical contacts is considerably less than in test systems using the known contact pins.

In one preferred embodiment, the suction tube surrounds a coaxial inner part like a sleeve, and the reduced pressure can be produced in an annular end area between the suction tube and the inner part. This results in an annular suction zone, which leads to robust positioning and force action on the solder balls.

These effects can be further reinforced by widening the cross section of the configuration including the suction tube and the coaxial inner part, toward the end area of the contact pin end.

The suction effect and the positioning can also be reinforced by arranging a suction collar, which opens substantially in a hemispherical shape and into which the solder balls are inserted during suction, on the end area of the free contact pin end.

Other features which are considered as characteristic for the invention are set forth in the appended claims.

Although the invention is illustrated and described herein as embodied in a contact pin for testing microelectronic components having substantially spherical contacts, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
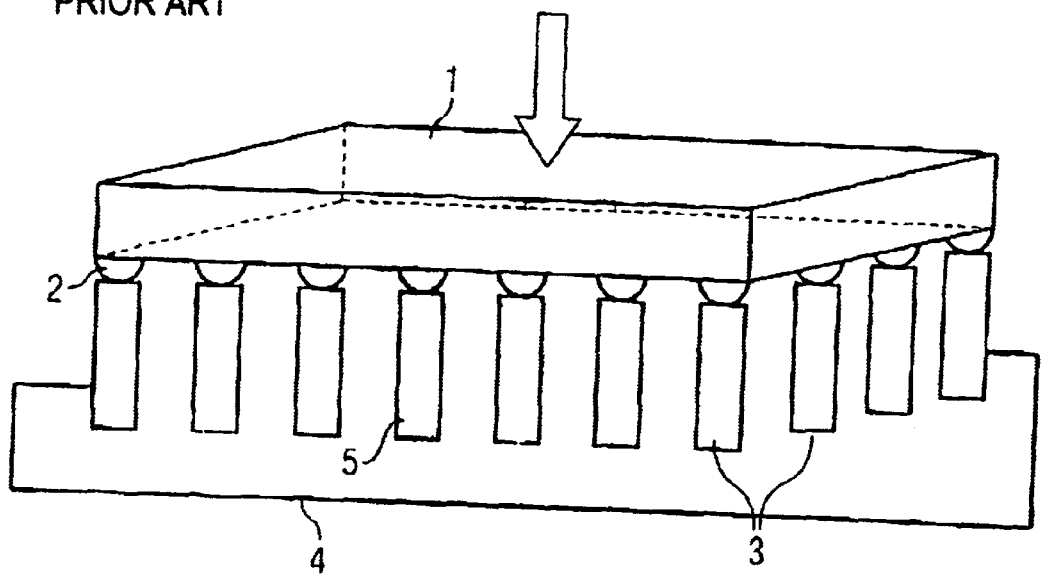
FIG. 1 is a schematic side view of a BGA component having solder balls that interact with prior art contact pins in the shown operating position.

Referring now to the figures of the drawing in detail and first, particularly, to FIG. 1 thereof, there is schematically shown a known test system. FIG. 1 shows an IC component 1 with solder balls 2 arranged in the form of a matrix on the lower face. In this perspective, the rear face of the IC component 1 forms the upper face thereof. A contact-pressure force is exerted on the upper face, as indicated by the direction of the shown arrow, after, for example, the contact pins have approached the component 1. The component 1 and the cap 4 with the individual contact pins embedded in it are shown. Only the free ends 3 of the contact pins are shown. The component 1 and the cap 4 are shown in the operating position, so that a mechanical and electrical contact is made between the contact pin ends 3—to be more precise, their end areas 5—and the solder balls 2. This known test arrangement has the disadvantages mentioned initially.

Figure 2:
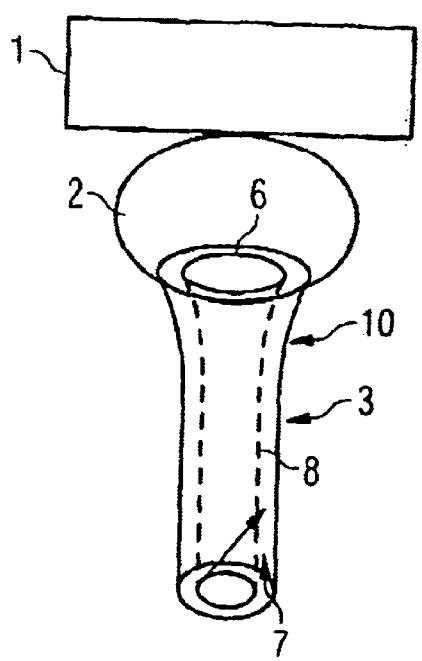
FIG. 2 is a schematic side view of a free end of an inventive contact pin interacting with a solder ball.

FIG. 2 shows an embodiment of the invention in which the contact pin end 3 is in the form of a suction tube 7 such that a reduced pressure acts in an annular end area 6 of the contact pin end 3. This reduced pressure draws the contact pin end 3 against the lower face of the approaching solder ball 2 and a relatively robust connection is formed, corresponding to the suction force that is used. On the one hand, this ensures that the contact pin end 3 is positioned in a fixed manner with respect to the solder ball 2 during the electrical test. On the other hand, as desired, a reliable electrical contact is also made.

The annular end area 6 which, in non-complex manner, may be formed by an inner part 8 which is surrounded coaxially or like a sleeve by the suction tube 7 results in a certain amount of concentration of the suction force in comparison to a single suction tube 7 with a correspondingly larger suction cross section. The robustness of the contact is advantageously increased by widening the contact pin end 3 as indicated in FIG. 2. This widening 10 of the cross section creates a better complementary surface for the solder balls 2. The slight lowering of the inner part 8 with respect to the end surface 5 of the contact pin end 3 even makes it possible to provide a funnel-like holder.

Figure 3:
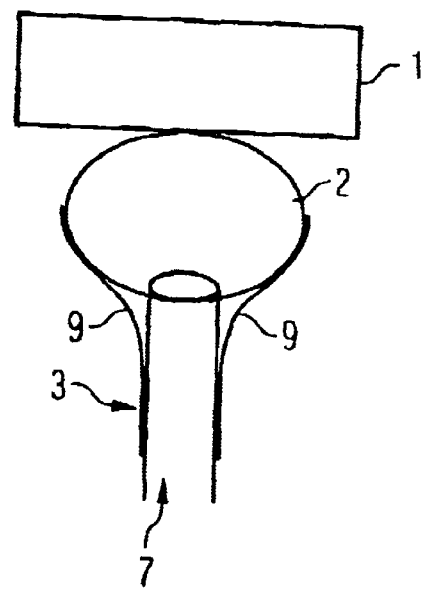
FIG. 3 is a schematic side view of a modified embodiment of an inventive contact pin.

FIG. 3 shows a cylindrical contact pin end 3 to which a suction collar 9 has been fitted. In this case, a thin elastic material can be used for the suction collar 9, so that the suction collar 9 then fits like a cup onto the lower face of the solder balls 2, thus ensuring seating and sealing, and hence a reliable contact.

The solder balls 2 typically have a diameter of 1 to 2 mm. Contacts such as the solder balls 2 in some cases include only a lower hemisphere, but which can nevertheless be regarded as "spherical contacts" for the purposes of the invention. In order for the suction tube 7 to be sucked onto the solder balls 2, the diameter of the solder balls 2 must be at least somewhat larger than that of the suction tube 7. All of the variants of the inventive contact pins can advantageously be used with a similar test system to that shown in FIG. 1. In particular, the contact pins are advantageously arranged in a cap 4 and jointly approach and make contact with the corresponding solder balls 2 until the suction force draws the solder balls 2 and the contact pin ends 3 against one another.

The contact pins are normally arranged separated in the cap 4 by 0.50 to 2.54 mm, depending on the pitch distance (between the centers of the solder balls). The component 1 may be an unencapsulated chip (flip chip technology) or a chip with a BGA pack. Not only individual ICs but also MCMs (Multi Chip Modules) or other microelectronic assemblies may be used as the component 1.

The inventive contact pin and the suction tube 7 can in any case be used in conjunction with a conventional spring contact pin. This may make it possible, if required, to carry out the electrical functional test of the spherical contacts with a similar contact force, but with considerably less pressure against the component 1, than in the past.

I claim:

1. A contact pin for testing a microelectronic component having a substantially spherical contact with a diameter, the contact pin comprising:

a cylindrical first contact pin end part having an end area, said contact pin end part formed as a suction tube for providing a reduced pressure at said end area;

said suction tube having an internal diameter being less than the diameter of the spherical contact of the microelectronic component, so that a mechanical and electrical contact can be produced by sucking the spherical contact of the microelectronic component onto said end area of said first contact pin end part as the spherical contact of the microelectronic component approaches said end area of said first contact pin end part.

2. The contact pin according to claim 1, comprising:

a coaxial inner part; and an annular end area formed between said suction tube and said coaxial inner part;

said suction tube forming a sleeve surrounding said coaxial inner part; and the reduced pressure being provided at said annular end area.

3. The contact pin according to claim 2, wherein said suction tube and said coaxial inner part have a cross-sectional area that widens toward said end area of said contact pin end part.

4. The contact pin according to claim 1, comprising:

a suction collar configured on said end area of said first contact pin end part;

said suction collar opening substantially in a hemispherical shape.

5. The contact pin according to claim 4, wherein said suction collar is made of elastic material.

6. The contact pin according to claim 1, in combination with the microelectronic component, wherein the microelectronic component includes a Ball Grid Array pack.

7. A spring contact pin for testing a microelectronic component having a substantially spherical contact with a diameter, the contact pin comprising:

a cylindrical first contact pin end part having an end area, said contact pin end part formed as a suction tube for providing a reduced pressure at said end area;

said suction tube having an internal diameter being less than the diameter of the spherical contact of the microelectronic component, so that a mechanical and electrical contact can be produced by sucking the spherical contact of the microelectronic component onto said end area of said first contact pin end part as the spherical contact of the microelectronic component approaches said end area of said first contact pin end part.

* * * * *